(12) United States Patent
Alcoe et al.

(10) Patent No.: US 6,570,259 B2
(45) Date of Patent: May 27, 2003

(54) APPARATUS TO REDUCE THERMAL FATIGUE STRESS ON FLIP CHIP SOLDER CONNECTIONS

(75) Inventors: David J. Alcoe, Vestal, NY (US); Eric A. Johnson, Greene, NY (US); Matthew M. Reiss, Endwell, NY (US); Charles G. Woychik, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/814,789

(22) Filed: Mar. 22, 2001

(65) Prior Publication Data

US 2002/0135063 A1 Sep. 26, 2002

(51) Int. Cl.[7] .................. H01L 23/48; H01L 23/52; H01L 29/40
(52) U.S. Cl. .................. 257/778; 257/737; 257/747; 257/795; 174/52.2
(58) Field of Search ................ 257/778, 779, 257/783, 737, 747, 795; 174/52.2, 52.3; 438/221, 222, 223, 224

(56) References Cited

U.S. PATENT DOCUMENTS

| | | | |
|---|---|---|---|
| 4,604,644 A | | 8/1986 | Beckham et al. ............. 357/80 |
| 5,194,930 A | | 3/1993 | Papathomas et al. ........ 257/773 |
| 5,203,076 A | | 4/1993 | Banerji et al. ................. 29/840 |
| 5,249,101 A | | 9/1993 | Frey et al. .................... 361/717 |
| 5,309,026 A | | 5/1994 | Matsumoto ................... 257/787 |
| 5,578,525 A | | 11/1996 | Mizukoshi .................... 437/206 |
| 5,720,100 A | * | 2/1998 | Skipor et al. .................. 29/840 |
| 5,811,317 A | * | 9/1998 | Maheshwari et al. ......... 29/827 |
| 5,834,848 A | * | 11/1998 | Iwasaki ........................ 257/778 |
| 5,844,319 A | * | 12/1998 | Gamota et al. .............. 257/667 |
| 5,898,224 A | * | 4/1999 | Akram ......................... 257/659 |
| 6,011,301 A | | 1/2000 | Chiu ........................... 257/678 |
| 6,046,910 A | * | 4/2000 | Ghaem et al. .............. 174/260 |
| 6,057,597 A | * | 5/2000 | Farnworth et al. .......... 257/698 |

* cited by examiner

Primary Examiner—Lincoln Donovan
Assistant Examiner—K. Lee
(74) Attorney, Agent, or Firm—Salzman & Levy; Lawrence R. Fraley

(57) ABSTRACT

The present invention provides a package for a semiconductor chip that minimizes stresses and strains that arise from differential thermal expansion on chip-to-substrate or chip-to-card interconnections. A collar element of one or more elements is provided. Adhesive material connects the collar element to the electric device and to the substrate that supports it, forming a unitary electrical package.

19 Claims, 5 Drawing Sheets

APPARATUS TO REDUCE THERMAL FATIGUE STRESS ON FLIP CHIP SOLDER CONNECTIONS

FIELD OF THE INVENTION

The present invention relates to microelectronic packaging of semiconductor chips and, more specifically, to IC flip chip assemblies designed to reduce the structural damage to C4 interconnections due to thermal stress and the CTE mismatch of the chip and the packaging material.

BACKGROUND OF THE INVENTION

Advances in microelectronics technology tend to develop chips that occupy less physical space while performing more electronic functions. Conventionally, each chip is packaged for use in housings that protect the chip from its environment and provide input/output communication between the chip and external circuitry through sockets or solder connections to a circuit board or the like. Miniaturization results in generating more heat in less physical space, with less structure for transferring heat from the package.

The heat of concern is derived from wiring resistance and active components switching. The temperature of the chip and substrate rises each time the device is turned on and falls each time the device is turned off.

As the chip and the substrate ordinarily are formed from different materials having different coefficients of thermal expansion (CTE), the chip and substrate tend to expand and contract by different amounts, a phenomenon known as CTE mismatch. This causes the electrical contacts on the chip to move relative to the electrical contact pads on the substrate as the temperature of the chip and substrate changes. This relative movement deforms the electrical interconnections between the chip and printed wiring board (PWB) and places them under mechanical stress. These stresses are applied repeatedly with repeated operation of the device, and can cause fatigue of the electrical interconnections. This is especially true for the solder ball of the controlled collapse chip connection, also known as "C4", connections. It is therefore important to mitigate the substantial stress caused by thermal cycling as temperatures within the device change during operation.

One type of semiconductor chip package includes one or more semiconductor chips mounted on a circuitized surface of a substrate (e.g., a ceramic substrate or a plastic composite substrate). Such a semiconductor chip package is usually intended for mounting on a printed circuit card or board. In the case of a ball grid array (BGA) package, the chip carrier includes a second circuitized surface opposite the surface to which the chip is attached. This, in turn, is connected to the printed circuit card or board.

Chip carriers of this type provide a relatively high density of chip connections and are readily achieved by mounting one or more semiconductor chips on the circuitized surface of a chip carrier substrate in the so-called "flip chip" configuration.

Flip chip bonding is described by Charles G. Woychik and Richard C. Senger, "Joining Materials and Processes in Electronic Packaging" in PRINCIPLES OF ELECTRONIC PACKAGING, by Donald P. Seraphim, Ronald Lasky and Che-Yu Li, McGraw-Hill Book Company, New York, N.Y. (1988), at pages 577 to 619; and by Nicholas G. Koopman, Timothy C. Reiley, and Paul A. Totta, "Chip-To-Package Interconnections" in MICROELECTRONIC PACKAGING HANDBOOK, by Rao R. Tummala and Eugene Rymaszewski, Van Nostrand Reinhold, New York, N.Y. (1988), at pages 361 to 453.

Flip chips are small semiconductor dies having terminations all on one side of the entire face of the die in the form of a pattern of solder pads or bump contacts. These solder bumps are deposited on solder wettable terminals on the chip. Typically, the surface of the chip has been passivated or otherwise treated. In this way the use of a flip chip package allows full population area arrays of I/O. The flip chip derives its name from the practice of flipping or turning the chip over after manufacture, prior to attaching the chip to a matching substrate.

As described by Seraphim et al. and Tummala et al., an electronic circuit contains many individual electronic circuit components: thousands or even millions of individual resistors, capacitors, inductors, diodes, and transistors. These individual circuit components are interconnected to form the circuits. The individual circuits are interconnected to form functional units. Power and signal distribution are performed through these interconnections. The individual functional units require mechanical support and structural protection. The electrical circuits require electrical energy to function and the removal of thermal energy to remain functional. Microelectronic packages such as chips, modules, circuit cards, circuit boards, and combinations thereof are used to protect, house, cool, and interconnect circuit components and circuits.

In the flip chip configuration, the chip or chips are mounted active-side-down on solderable metal pads on the substrate using solder balls, a C4 connection, a gold bump, or a conductive epoxy.

Controlled collapse chip connection in flip chip technology has been successfully used for about 30 years for interconnecting high I/O count and area array solder bumps on the silicon chips to the base ceramic chip carriers (e.g., alumina carriers). In the C4 process, as distinguished from the flip chip process, the solder wettable terminals on the chip are surrounded by ball limiting metallurgy (BLM), and the matching footprint of solder wettable terminals on the card is surrounded by a solder mask. These structures act to limit the flow of molten solder during reflow.

Bonding can be used in an unpackaged configuration known in the art as direct chip attach (DCA): the direct connection of a chip to a card or board without an intermediate layer of packaging. The combination of a chip mounted on an intermediate carrier is usually described as the "first level package". DCA can be a lower cost method of connecting a chip to a card, since the first level package is thereby eliminated.

For direct chip attach, individual IC chips are mounted on the cards or boards. The space between the mounted chip and the card or board is then filled with an epoxy resin. By this expedient, the standoff between the IC chip and the card or board is encapsulated with epoxy.

If a polymeric dielectric card or board is employed, the DCA process requires low temperature solder metallurgy. Moreover, direct chip attach, when used with an underfill, increases the fatigue resistance of the C4 solder interconnections to thermal cycling, acts as an alpha emission barrier to MOSFET memory chips, is a parallel thermal path for heat dissipation, and provides physical protection to the chips and C4 solder interconnections.

However, one problem encountered with the combination of DCA and C4 bonding is the difficulty of reworking the encapsulated package. In order to improve rework and to accommodate the CTE mismatches between the chip and the PWB, many prior art proposals have been developed to connect integrated circuit chips to printed wiring boards via an intermediate element. Often, chip carriers are interposed between the chip and the circuit board; the CTE of the chip carrier is itself chosen as some intermediate value to provide a reasonable match to both the chip and to the printed circuit board. The very large difference in CTE between the silicon device and the printed circuit board generally requires some intermediate device carrier. One such type of interconnection mounts the integrated circuit chip on a ceramic chip carrier or module, which module is mounted on a circuit board. One or more chips may be mounted on each device carrier or module, and one or more modules may be mounted on any given circuit board. In a particularly well known type of configuration, the integrated circuit chip is mounted onto a ceramic module by flip chip bonding wherein the I/O pads on the face of the chip are bonded to corresponding pads on the module. Such connections are formed by solder bumps or solder balls normally using solder reflow techniques. It is these connections that are referred to as C4 connections.

Most conventional single and multiple chip packages are typically constructed from thick, mechanically robust, dielectric materials, such as ceramics (e.g., alumina, aluminum nitride, beryllium oxide, cordierite, and mullite) and reinforced organic laminates (e.g., epoxies with woven glass, polyimides with woven glass, and cyanate ester with woven glass). In some cases, materials are combined to produce certain improved properties. For example, a package may have a ceramic base with one or several thin films of polyimides or benzocyclobutane (BCB) disposed thereupon.

In an attempt to overcome the problem of thermal mismatch between the chip carrier and the circuit board it has been proposed to fashion the chip carrier from a material similar to that of the circuit board. Such techniques are described in IBM Technical Disclosure Bulletin Vol. 33, No. 2, pages 15–16 and IBM Technical Disclosure Bulletin Vol. 10, No. 12, pages 1977–1978. However, both of these references require that the connections, at least for the signal I/O lines, be on the same side of the carrier as that to which the chip is mounted. These techniques do solve the problem of thermal mismatch between the chip carrier and the circuit board, but require peripheral I/O bonding and an additional interposer between the chip and the chip carrier. IBM Technical Disclosure Bulletin Vol. 10, No. 12 requires peripheral attachment of the chip to an interposer (carrier 2) which is bonded to the chip carrier and then attached to the card. This peripheral bonding on the chip limits the I/O that can be placed on a small chip.

As noted above, whether the chip is attached to a carrier or directly to the PWB, these structures are made of materials with coefficients of thermal expansion that differ from the CTE of the material of the semiconductor device: silicon. Normally the device is formed of monocrystalline silicon with a coefficient of thermal expansion of 2.5–3.0 ppm/° C. If the substrate is formed of a ceramic material, typically alumina with a coefficient of expansion of 5.5–6.5 ppm/° C., then the mismatch in thermal expansion is relatively small. The problem is exacerbated with less expensive substrate materials, such as fiberglass, that have a CTE of roughly 17 ppm/° C.

The stress on solder bonds during operation is approximately proportional to (1) the magnitude of the temperature fluctuations, (2) the distance of an individual bond from the neutral or central point (DNP), and (3) the difference in the coefficients of expansion of the material of the semiconductor device and the substrate. Stress is also inversely proportional to the height of the solder bond (i.e., the spacing between the device and the support substrate). The seriousness of the situation is further compounded by the fact that, as the solder terminals become smaller in diameter in order to accommodate the need for greater density, the overall height decreases.

In order to strengthen solder joints without affecting the electrical connection, the gap is filled with a polymeric encapsulant, typically a filled polymer. The encapsulant is typically applied after the solder bumps are reflowed to bond the integrated circuit die to the printed circuit board. A polymeric precursor is dispensed onto the board adjacent the die and is drawn into the gap by capillary action. The precursor is then heated and cured to form the encapsulant. This curing can also create stresses that can be detrimental to the die.

An improved solder interconnection structure with increased fatigue life was disclosed in U.S. Pat. No. 4,604,644 to Beckham, et al., assigned to the present assignee, disclosure of which is hereby incorporated by reference. The Beckham patent discloses a structure for electrically joining a semiconductor device to a support substrate that has a plurality of solder connections. Each solder connection is joined to a solder wettable pad on the device and to a corresponding solder wettable pad on the support substrate. Dielectric organic material is disposed between the peripheral area of the device and the facing area of the substrate. The material surrounds at least one outer row and column of solder connections but leaves the solder connections in the central area of the device free of dielectric organic material.

Other prior art solutions make use of an underfill material disposed between the chip and the supporting substrate in an attempt to redistribute the stress caused by CTE mismatch. Without the underfill material, this stress is wholly borne by the solder balls. The underfill material allows this stress to be more uniformly spread out over the entire surface of the chip, supporting substrate and solder balls. Examples of the use of underfill materials may be found in U.S. Pat. Nos. 5,194,930, 5,203,076, and 5,249,101.

After soldering the IC to the substrate, an epoxy resin or other material is inserted into the space between the IC and the substrate and acts as a glue. In addition to being inserted into the space, surface tension produces a capillary action between the IC and the substrate that pulls the epoxy into the space. The epoxy is also pulled up along the sides of the IC by the surface tension. To make the mechanical bond of the epoxy even stronger, it is possible to roughen the surface of the substrate or the IC, chemically for instance, before applying the epoxy underfill.

An epoxy, after being introduced under capillary action into a space provided between the semiconductor chip and the package substrate, is cured and hardened. The hardened epoxy acts to bond the semiconductor chip to the package substrate and to protect the fragile solder connections.

The normal flow in a flip chip attach process is as follows: a) the die is fluxed; b) the die is placed on the substrate with bond pads on the die being aligned with bond pads on the substrate; c) solder is reflowed between bond pads on the die and substrate; d) the die is underfilled with a thermoset material; and e) the underfill material is fully cured.

Underfilling ensures minimum load on the interconnects and becomes the primary load bearing member between the chip and the substrate during thermal or power cycling induced due to the operation of the chip. Thermoset type materials are commonly used in the industry as underfill material. In order for the epoxy to bear much of the load it must be relatively rigid. As a result the chip and substrate are strongly coupled so that differential thermal expansion causes bending of the package when the temperature varies from that at which the epoxy was cured. In extreme cases this bending can cause cracking of the chip but, with proper design, this problem may be overcome. Without the epoxy this differential expansion causes shear in the C4 solder joints but little package bending. Warpage tends to be smaller when thicker organic substrates are used and greater as the rigidity and thickness of the substrate decreases.

SUMMARY OF THE INVENTION

Accordingly, it is a general object of the present invention to provide novel and useful semiconductor devices wherein the foregoing problems are mitigated.

One specific object of the present invention is to provide a package for the semiconductor chip that minimizes stresses and strains that arise from differential thermal expansion on the chip-to-substrate or chip-to-card interconnections.

Another object of the present invention is to provide a package that can be readily modified to changes in chip size and configuration.

Another object of the present invention is to design a package that allows adhesive or underfill to be applied after the package has been assembled.

In accordance with the present invention, there is provided an electrical package that includes a substrate with an upper surface, having at least one electrical circuitry connecting pad. An electric device is also provided with a first modulus of elasticity. The electric device has a connection region on its lower major surface. At least one flexible connector links the connecting pad(s) to the connection region. A collar is also provided with a second modulus of elasticity. The vertical side or dimension of the collar is shorter than the electric device perimeter and is bonded to the perimeter. The horizontal side or dimension of the collar is bonded to the substrate upper surface. The adhesive material has a third modulus of elasticity. Thus, a unitary electrical package is formed that includes the electric device, the substrate and the collar. The second modulus of elasticity is at least as large as the third module of elasticity.

BRIEF DESCRIPTION OF THE DRAWINGS

A complete understanding of the present invention may be obtained by reference to the accompanying drawings (not drawn to scale) when considered in conjunction with the subsequent detailed description, in which.

DETAILED DESCRIPTION OF PREFERRED EMBODIMENTS

Generally speaking, the present invention reflects a novel solution to the problem of thermal mismatch between chips and PWBs. The concept is to enlarge the effective area of the chip using a less expensive material and in effect move the edge beyond the true periphery of the chip. In doing so, interconnections may be located over the entire surface of the chip without incurring the increase in strain that has been shown to occur near its edges. In the present invention, materials to enlarge the effective area of the chip are referred to as "collar elements".

In the description which follows, the words "horizontal", "vertical", "upper", "lower", etc. are used to designate direction relative to the major surfaces of the semiconductor chip and the printed wiring board.

Figure 1:
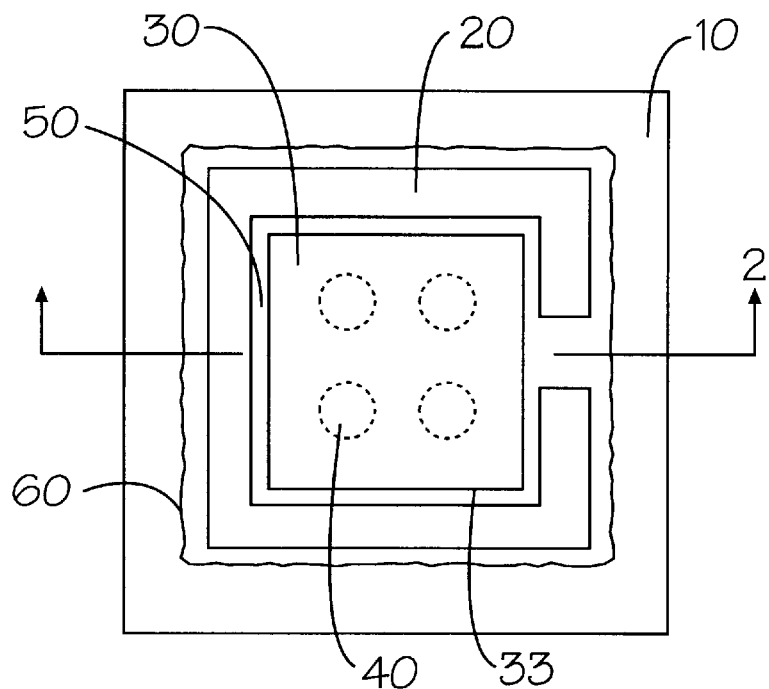
FIG. 1 illustrates a top view of an electrical assembly comprising a silicon chip partially surrounded by and bonded to a unitary collar arrangement in accordance with the present invention.
Figure 2:
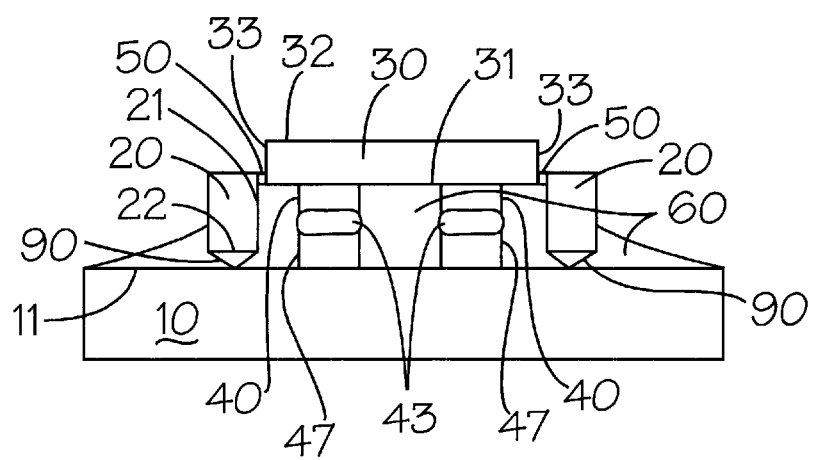
FIG. 2 illustrates a cross-section view of the electrical assembly of FIG. 1.
Figure 3:
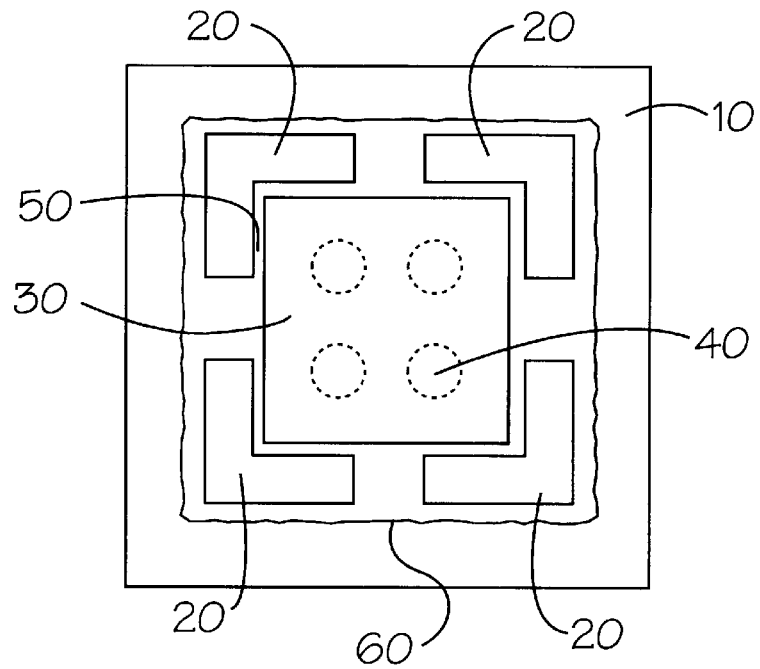
FIG. 3 illustrates a top view of an electrical assembly comprising a silicon chip partially surrounded by and bonded to a plural element collar arrangement.
Figure 4:
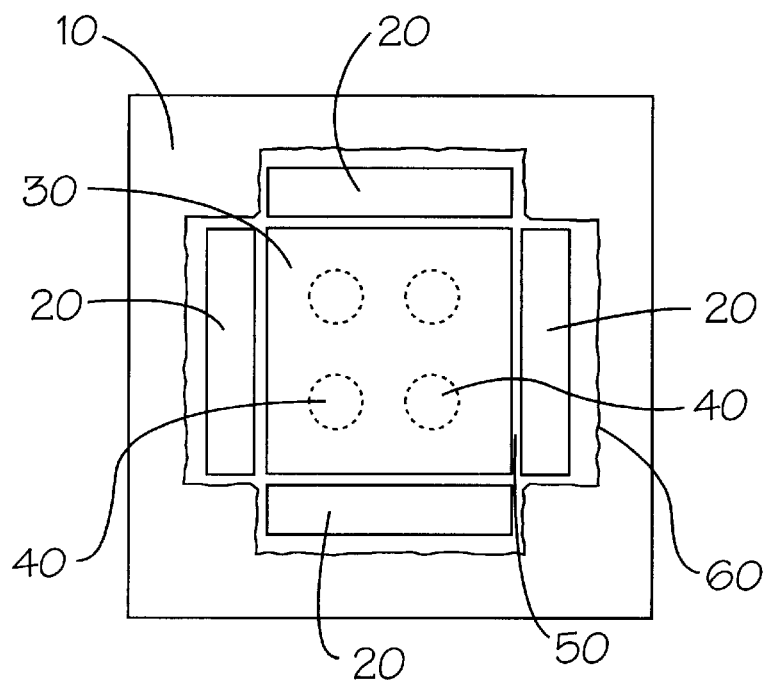
FIG. 4 illustrates a top view of an alternate embodiment of an electrical assembly comprising a silicon chip partially surrounded by and bonded to a plural element collar arrangement.
Figure 5:
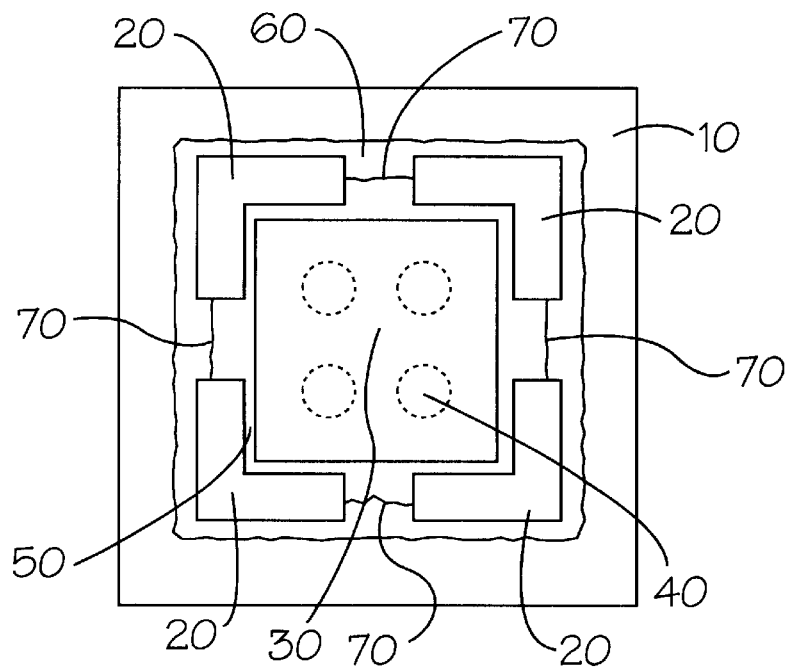
FIG. 5 illustrates a top view of another embodiment of an electrical assembly comprising a silicon chip partially surrounded by and bonded to a plural element collar arrangement having connecting elements.
Figure 6:
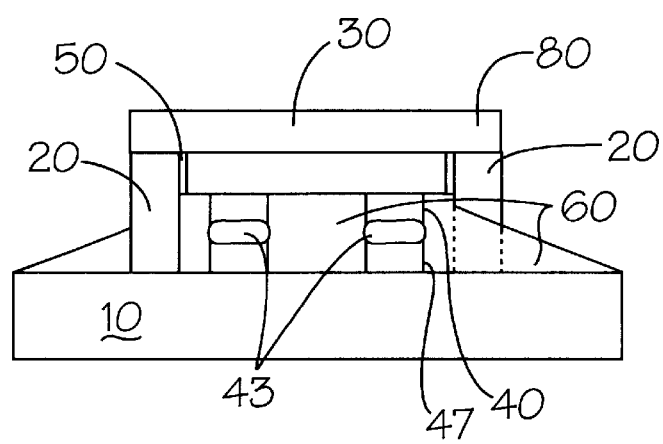
FIG. 6 illustrates a cross-section view of one embodiment of an electrical assembly containing an optional coverplate on the upper surface of a silicon chip.
Figure 7:
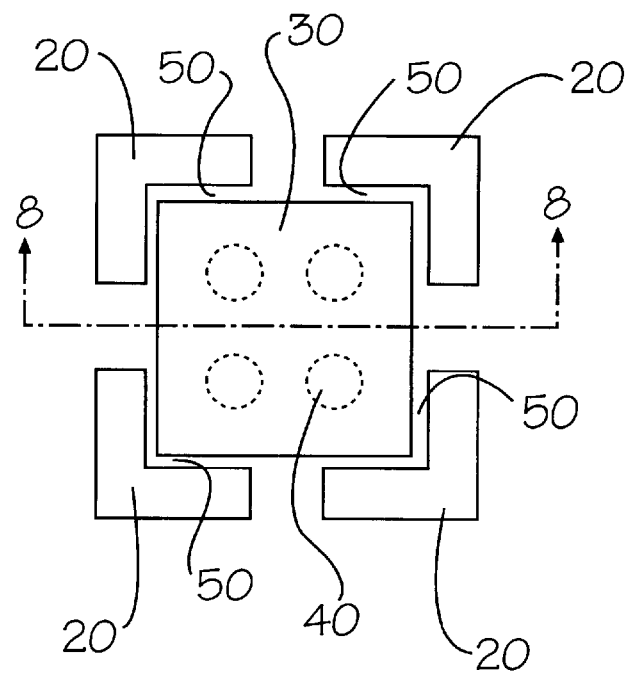
FIG. 7 illustrates a top view of an electrical subassembly having a plurality of collar elements bonded to the perimeter of a silicon chip.
Figure 8:
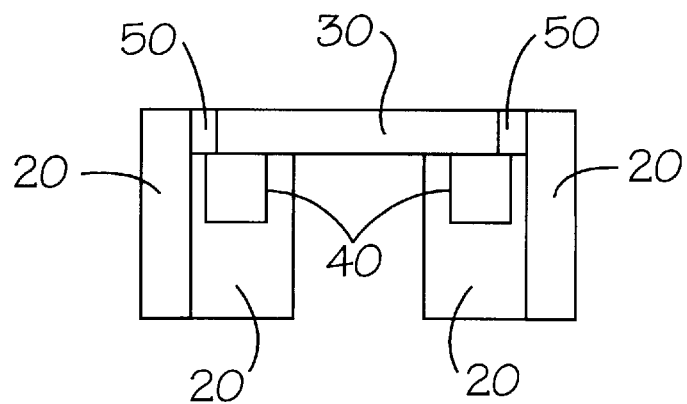
FIG. 8 illustrates a cross-section view of the electrical assembly of FIG. 7.

Referring now to FIGS. 1 and 2, there is shown a substrate 10 on which is disposed a collar element 20 surrounding an IC chip 30. The silicon wafer or chip 30 is preferably in a flip chip mode (i.e., active side of the chip facing the packaging substrate). The substrate 10 may be a circuitized substrate, printed wiring board, circuit board, or circuitized laminate. For the purposes of the invention, all these terms are taken to be synonymous. However, the present invention encompasses the attachment of the flip chip 30 either directly to the circuitized board 10 or to an intermediary chip carrier, not shown.

The circuit board 10 can be selected from known materials currently utilized in the technology having either a rigid or flexible composition, including flex base. Such structures are especially useful for flip chip attachment to flexible or rigid organic circuit boards or modules such as PBGA, DCAM, MCM-L, and other chip carrier packages in which the front or active side of the chip is attached to a structure with a relatively high CTE, and the back side of the chip is connected directly to heat sinks, not shown.

A well known technique for accomplishing a solder coupling includes what is known in the industry as a controlled collapse chip connection (C4) procedure. Another known process is a thermal compression bonding (TCB) procedure. The flexible circuitry (tape) may then be coupled electrically to respective circuitry formed on the surfaces of another flex circuit, or on a more rigid printed circuit board, or on a ceramic substrate, or the like.

Useful materials for substrates 10 in the present invention include: ceramics, epoxy, epoxy glass, resin, or plastics. Preferred polyesters include polyethyleneterephthalate (PET), polybutyleneterephthalate (PBT), and polyadipoylnapthylene (PAN). PAN is especially useful because of its low thermal distortion properties.

Figure 9:
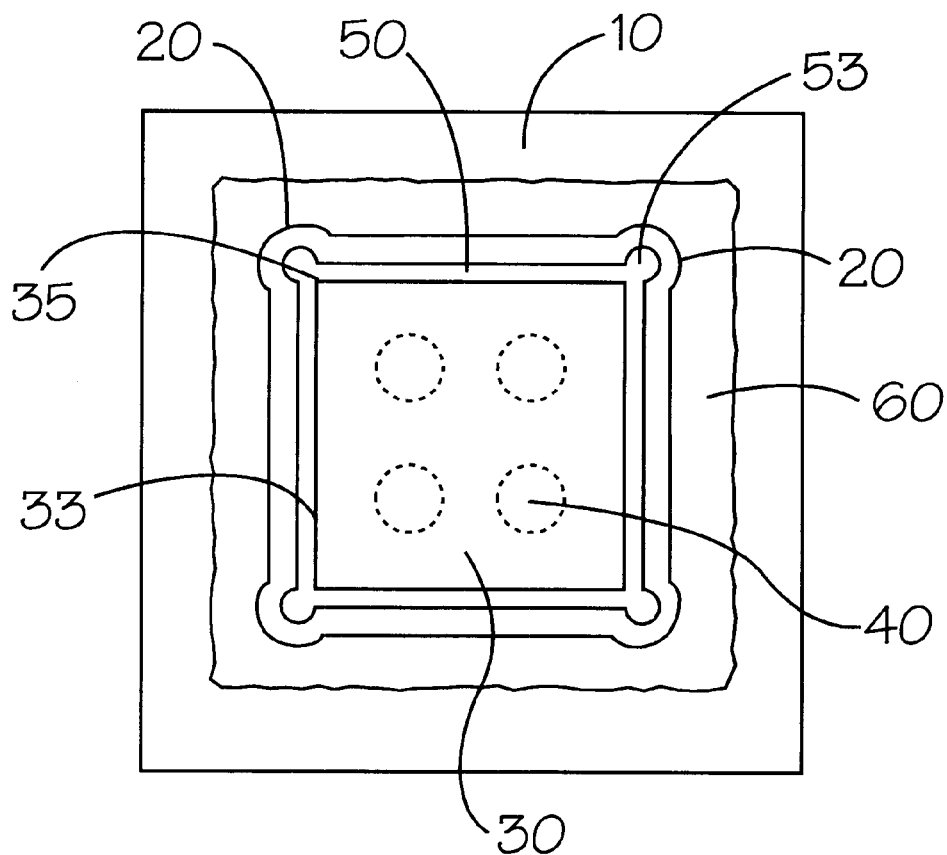
FIG. 9 illustrates a top view of an electrical assembly having a unitary collar surrounding and bonded to a silicon chip that is affixed to a substrate.

Collar element 20 can be either a unitary element (FIGS. 1 and 9) or can be subdivided into a plurality of elements (FIGS. 3, 4, 5, 7). In either case, the entire perimeter 33 of the chip 30 is not bonded to these collar elements 20. Unlike prior art uses for structural elements that might be similar to the collar 20 of the present invention, the present collar element 20 need not serve the function of stiffener or heat dissipating element.

Preferably, the collar elements 20 have two independent characteristics: low coefficient of thermal expansion and high modulus of elasticity. Preferred materials for the collar elements 20 have a CTE and modulus of elasticity identical or similar to the silicon chip 30. Appropriate materials for collar elements 20 include alloy 46, 420 stainless steel, copper, silicon, glass, glass cloth, filled polymers, cermets or ceramics. In one embodiment, the collar elements 20 comprise glass cloth or flexible ribbon that is placed around the perimeter 33 of the chip 30. These latter materials are then adhesively affixed with epoxy or later attached during the process to apply underfill 60.

Finite element modeling has been used to estimate the effect of such a collar 20. For a particular SRAM PBGA package, a 10-mil thick, stainless-steel collar, with a 2 to 4 mil gap 50 from the silicon chip edge, reduces the strain of C4s by up to 20%. These C4s were located at 8 mils from the edges of the chip 30. Benefits have been shown to be greater when C4s are even closer to the edges.

As noted hereinabove, the collar element 20 design for the present invention typically does not completely enclose the perimeter 33 of the chip 30. In one case, however, shown in FIG. 9, the unitary collar element 20 completely encloses the chip 30. It differs in design in that the sidewall gap 50 between the collar dimension 21 and the chip perimeter 33 is increased at the corners 35 of the perimeter 33 to a larger gap 53. This design helps alleviate the largest stress forces found at the corners 35 of the chip 30.

Analysis of the stress-strain response indicates that a preferred gap of about 2 to about 4 mils between the chip edge perimeter 33 and the dimension 21 of the collar 20 gives a good reduction in solder connection thermal strain. Within this gap range, the collar 20 and device 30 are interactively linked to reduce the detrimental edge effect. The benefit of the collar element 20 is due primarily to the restraint of the tendency of the laminate and the underfill to shrink (or expand) near the chip perimeter 33. Broken ring designs, as illustrated in FIGS. 1 through 8, are preferable embodiments. Importantly, this allows inclusion of an underfill dispense port, with no significant loss of improvement.

The collar 20 can take the form of straight elements (FIG. 4) and can be bonded to at least a portion of the straight dimensions of the perimeter 33. In this case, four potential ports can be used to dispense underfill.

In an alternative design, the collar 20 can take the form of four L-shaped elements, each designed to bond to a corner 35 of the chip 30. Four potential ports are available to dispense underfill.

In another embodiment (FIG. 9), the corner regions of the L-shaped collar elements 20 of a unitary collar arrangement are manufactured to create a widened gap 53, as shown.

The collar elements 20 may also have a "standoff" leg 90 (FIG. 2) attached to its second horizontal surface 22, such that the distance between the lower collar surface 22 and the upper major surface 11 of the substrate 10 is fixed. Furthermore, underfill can seep beneath the lower surface 22 in order to assist in filling the region beneath lower major surface 31 of the chip 30 or provide an escape for air during the filling process. The standoff leg 90 is approximately the height of the C4 connectors 40, 43, and 47, and thus the height between the chip 30 and the substrate or laminate 10.

As an alternative to using a standoff leg 90, another assembly method for the present invention entails attaching the collar elements 20 to a temporary carrier, not shown. The collar elements 20 are placed around the chip 30 with the carrier resting on the upper surface 32 of the chip 30. The collar elements 20 are designed to create a gap between the second dimension 22 and the upper surface 11 of the substrate 10. After the collar 20 and chip 30 are underfilled, the temporary carrier can be removed from the upper surface 32 and collar elements 20. Additionally, the carrier can be used as a cooling element for the chip 30. In this mode it is not removed at the end of the manufacturing process.

In another optional feature, the collar elements 20 contain holes perpendicular to the chip perimeter 33 such that the underfill adhesive can flow through the hole during the filling operation, thereby providing mechanical interlocking.

In another embodiment, a plurality of collar elements 20 is employed to position devices or connecting elements 70 (FIG. 5) linking the collar elements 20 to each other. These connecting elements 70 assist in positioning and maintaining individual collar elements 20 until they are made immobile by later underfilling or bonding steps.

The collar 20 can further comprise a coverplate 80 (FIG. 6) that is designed to reside on the upper surface 32 of the chip 30. The function of the coverplate 80 is to help eliminate unwanted heat from the chip 30. The coverplate 80 may be bonded to the upper surface 32 using materials described below.

To mount the chip carrier 10 to the chip 30, a solder reflow technique can be used. This technique uses solder bumps or C4s, corresponding to the pads. With each contact pad on the chip carrier being positioned on the appropriate solder bump on the chip, the assembly is heated so as to liquefy the solder and bond each contact pad to its associated solder bump.

Another common reflow method combines C4s, composed of solder alloys with a high melting point (for example, 3/97 Sn/Pb alloys) with eutectic solder. The eutectic solder is typically deposited on the substrate pads and is reflowed to form a fillet on each unmelted C4. The chip, chip carrier and solder interconnections together form the first level electronic package or module. The first level module is then attached to a PCB or circuit card in much the same way, using a grid of solder balls or BGA, corresponding to an array of conductive pads on the PCB.

Melting point is a consideration in the choice of solder alloys for C4s. High lead solders, especially 95/5 or greater ratio Pb/Sn, have been widely used with alumina ceramic substrates because of their high melting point (approximately 315° C.). Their use for the chip connection allows other lower-melting point solders to be used at the module-to-card or card-to-board packaging level without remelting the chip's C4s. Intermediate melting point solders such as eutectic 63/37 Sn/Pb (melting point 183° C.) and a 50/50 Pb/In melting point of approximately 220° C. have been used.

Some organic chip carriers are incompatible with high-melt solders. Epoxy resins can break down with prolonged or repeated exposure to temperatures as low as 250° C. For these applications eutectic or near-eutectic SnPb C4s have been successfully used, as have high-melt C4s with eutectic or near-eutectic fillets. Subsequent reflow of these joints during module-to-card or card-to-board assembly does not cause reliability problems of the first-level interconnections, provided the underfill remains well adhered.

The interconnect device of the present invention may contain conductive elements 40 and 47 (FIGS. 2 and 6) and have a required center flexible element 43. The flexible element 43 may be composed of a solder material or a conformable polymer material. The conformable polymer material comprises latex.

The conductive elements 40 and 47 are typically known as connecting pads and can be constructed on their outer surfaces of copper, silver, gold, and/or nickel.

Excellent results are achieved when the structures 40 and 47 comprise an IC chip, a carrier/substrate, a circuit card or the like. However, it should be understood that the features of the invention may by employed to interconnect other semiconductor structures.

The above discussion primarily relates to connections between two electrical components but it is within the scope of this invention that two distinct elements having differences in modalities can be connected through a flexible connection. For example, an optical-electrical connection or a conductive adhesive connection is specifically contemplated.

The perimeter wall 33 and the dimension 21 can be attached with a bonding agent. The bonding agent may have the same composition as that employed later as adhesive or underfill, used to affix the chip 30 to the substrate 10. Preferred bonding agents include filled epoxies such as Namics 8437-3. These agents may further be cured either thermally or by radiation in order to further secure the collar 20 to the chip 30.

There are two basic methods for underfilling the area below the lower major surface 31 of the chip 30 and the collar elements 20 with an adhesive 60. In the first embodiment, the collar element or elements 20 are positioned around the solder connected 43 portion of the chip 30, then underfilled. Alternatively, the underfill can be dispensed first and then the collar elements positioned. Most preferred for the present invention is the latter process. Materials that can be used for adhesively joining the lower major surface 31, encapsulating the connecting elements 40, 43, and 47 and collar elements 20 to the upper surface 11 of the substrate 10 are preferably an epoxy with a filler. This material reduces the mechanical stresses in the solder joints between the first solder balls 43 and their corresponding conductive pads 40 and 47. As noted above, these materials can optionally be used to bond the collar elements 20 to the chip perimeter 33.

Placement of the collar elements 20 with relation to the upper surface 11 of the substrate 10 is critical to the success of the present invention. The distance separating the second dimension 22 of the collar element 20 from the upper major surface 11 of the substrate 10 should be between about 50 to 100 microns.

In the embodiments that utilize more than one collar element 20, a positioning device 70 (FIG. 5) may be utilized. This device 70 comprises connectors that attach the plurality of collar elements 20 one to the next. In this manner the plurality of elements can be handled as a unitary entity that can easily be positioned around the periphery of the chip carrier or chip 10. Furthermore, the positioning device 70 securely maintains the relative positions of the plurality of collar elements 20 during the later manufacturing steps (e.g., bonding, underfilling and curing steps). The positioning device 70 is also designed so as not to hinder the underfilling process. Preferably, the positioning device 70 comprises a plurality of flexible members, each member linking two ends of adjacent collar elements 20.

The collar element 20 should be composed of a material that has a modulus of elasticity that is at least as large as the modulus of elasticity of either the adhesive underfill 60 or the device 30. Without being bound by theory, it is believed that the collar element 20 serves to reduce the stresses (due to the edge effect) at the periphery 33 and especially the corners 35 of the device 30 by artificially moving the boundaries of the device to beyond the true periphery 35 to the outer edges of the collar element 20. A similar benefit could be achieved by expanding the silicon wafer and employing interconnects further from the periphery 33. This is a very expensive approach, however, since the silicon wafers are extremely expensive and surface area yields would be decreased.

When the inventive process and design is used, the underfill stress, which is also known to be highest at the chip perimeter 33, is more evenly distributed and reduced so that the tendency to delaminate under the chip area is also reduced.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What we claim is:

1. An electrical package comprising components with compatible moduli of elasticity in order to reduce stress, said electrical package comprising:
   a) a substrate comprising an upper surface, said upper surface further comprising at least one electrical circuitry connecting pad;
   b) an electric device having a first modulus of elasticity and comprising upper and lower major surfaces separated by a predetermined thickness, said major surfaces defining a shape bounded by a perimeter, and said device comprising at least one connection region on said lower major surface;
   c) at least one flexible connector linking said at least one connecting pad to said at least one connection region;
   d) a collar element having a second modulus of elasticity and a first dimension and a second dimension, said first dimension comprising a length less than said device perimeter and at least a portion being bonded to said perimeter, and said second dimension being bonded to said substrate upper surface; and
   e) an adhesive material having a third modulus of elasticity no greater than said second modulus of elasticity of said collar element in order to relieve stress therebetween, said adhesive material adhering to at least a portion of said second side of said collar and to a portion of said upper surface of said substrate, thereby creating a unitary electrical package comprising said device, said substrate and said collar.

2. The electrical package as recited in claim 1, wherein said substrate comprises epoxy, epoxy glass, resin, or plastics.

3. The electrical package as recited in claim 1, wherein said collar element comprises a single element.

4. The electrical package as recited in claim 1, wherein said collar element comprises a plurality of elements each comprising a first dimension bonded to a portion of said electrical device perimeter.

5. The electrical package as recited in claim 4, wherein said collar elements are connected to each other by a positioning device.

6. The electrical package as recited in claim 1, wherein said first modulus of elasticity is approximately equal to said second modulus of elasticity.

7. The electrical package as recited in claim 1, wherein said second modulus of elasticity is approximately equal to said first modulus of elasticity, and said first modulus of elasticity is at least as great as said third modulus of elasticity.

8. The electrical package as recited in claim 1, wherein said perimeter comprises a corner and said first dimension of said collar element has a profile corresponding to said perimeter corner, thereby allowing said collar element to be adjacent said perimeter corner and affixed thereto.

9. The electrical package as recited in claim 1, wherein said collar element comprises silicon, ceramic, glass, or metals.

10. The electrical package as recited in claim 1, wherein no portion of said collar element is above the upper surface of said electric device.

11. The electrical package as recited in claim 10, further comprising a coverplate affixed to said collar element and contacting said upper surface of said electric device.

12. The electrical package as recited in claim 1, wherein said first dimension of said collar element extends below said electric device lower major surface, thereby creating a gap between said electrical device lower surface and said substrate upper surface.

13. The electrical package as recited in claim 12, wherein said gap is encapsulated in said adhesive.

14. The electrical package as recited in claim 13, wherein said adhesive comprises underfill material.

15. A manufacturing intermediate for an electrical package that comprises compatible moduli of elasticity in order to prevent stress, said manufacturing intermediate comprising:

a) an electric device having upper and lower major surfaces separated by a predetermined thickness, said major surfaces defining a shape bounded by a perimeter, and said device comprising at least one connection region on said lower major surface, said electric device having a first modulus of elasticity;

b) a collar element having a first dimension and a second dimension, said first dimension comprising a length less than said device perimeter, and at least a portion being bonded to said perimeter, said collar element being attachable to a substrate and being characterized by a second modulus of elasticity that is approximately equal to said first modulus of elasticity of said electric device; and c) a bond between at least a portion of said perimeter and said first dimension creating a unitary intermediate manufacturing electrical package comprising said device and said collar element.

16. The manufacturing intermediate for an electrical package as recited in claim 15, wherein said collar element comprises a single element.

17. The manufacturing intermediate for an electrical package as recited in claim 15, wherein said collar element comprises a plurality of elements each bonded to a portion of said electrical device perimeter.

18. The manufacturing intermediate for an electrical package as recited in claim 15, wherein said collar element comprises silicon, ceramic, glass, or metals.

19. The manufacturing intermediate for an electrical package as recited in claim 15, further comprising a coverplate affixed to said collar element and contacting said upper surface of said electric device.

* * * * *